(12) United States Patent
Klee et al.

(10) Patent No.: US 6,583,688 B2
(45) Date of Patent: Jun. 24, 2003

(54) TUNABLE FILTER ARRANGEMENT COMPRISING RESONATORS WITH REFLECTION LAYERS

(75) Inventors: Mareike Katharine Klee, Hueckelhoven (DE); Robert Frederick Milsom, Redhill (GB); Hans Peter Löbl, Monschau-Imgenbroich (DE); Rainer Kiewitt, Roetgen (DE); Uwe Mackens, Aachen (DE); Martinus Hermanus Wilhemus Maria Van Delden, Eindhoven (NL); Wilhelm Georg Hermann, Roetgen (DE); Olaf Wunnicke, Warburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/826,684

(22) Filed: Apr. 5, 2001

(65) Prior Publication Data

US 2001/0028285 A1 Oct. 11, 2001

(30) Foreign Application Priority Data

Apr. 6, 2000 (EP) .............................. 00302922

(51) Int. Cl.⁷ .......................... H03H 9/56; H03H 9/15; H03H 9/205
(52) U.S. Cl. ...................... 333/188; 333/191; 310/358
(58) Field of Search ................. 333/186–196, 333/133; 310/358

(56) References Cited

U.S. PATENT DOCUMENTS

| | | | | |
|---|---|---|---|---|
| 4,918,350 A | * | 4/1990 | Ando et al. ................. 310/320 |
| 4,933,230 A | * | 6/1990 | Card et al. .................. 428/242 |
| 5,166,646 A | * | 11/1992 | Avanic et al. ........... 333/193 X |
| 5,422,533 A | * | 6/1995 | Kosinski et al. ............. 310/335 |
| 5,446,306 A | | 8/1995 | Stokes et al. ............... 257/416 |
| 5,714,917 A | * | 2/1998 | Ellä ....................... 333/188 X |
| 5,864,261 A | * | 1/1999 | Weber ........................ 333/187 |
| 5,872,493 A | * | 2/1999 | Ella .......................... 333/191 |
| 6,066,581 A | * | 5/2000 | Chivukula et al. ............ 501/12 |
| 6,087,198 A | * | 7/2000 | Panasik ....................... 438/51 |
| 6,198,208 B1 | * | 3/2001 | Yano et al. .................. 310/358 |
| 6,204,737 B1 | * | 3/2001 | Ellä ....................... 333/189 X |
| 6,248,394 B1 | * | 6/2001 | Du et al. ..................... 427/100 |
| 6,278,342 B1 | * | 8/2001 | Ellä .......................... 333/189 |

FOREIGN PATENT DOCUMENTS

| | | |
|---|---|---|
| DE | 4020467 A1 | 1/1992 |
| EP | 1043741 A2 | 10/2000 |

OTHER PUBLICATIONS

"Physical Realization of Miniature Bandpass Filters with Single Sideband Characteristics", by Dale McLean, IEEE Transactions on circuit Theory, Mar. 1967, XP 002174503.

* cited by examiner

Primary Examiner—Barbara Summons
(74) Attorney, Agent, or Firm—Steven R. Biren

(57) ABSTRACT

The invention describes a tunable filter arrangement with a plurality of resonators which are coupled to one another and of which there is at least one which comprises a piezoelectric component made of a ferroelectric material and to which a DC voltage source is connected. The application of a DC voltage to the resonator renders it possible to change its electrical properties and thus the overall filter characteristic. Furthermore, a transmitter, a receiver device, and a mobile telephone device with such a filter arrangement are disclosed, aswell as a tunable bulk acoustic wave resonator.

8 Claims, 1 Drawing Sheet

TUNABLE FILTER ARRANGEMENT COMPRISING RESONATORS WITH REFLECTION LAYERS

BACKGROUND AND SUMMARY OF THE INVENTION

The invention relates to a tunable filter arrangement. The invention further relates to a transmitter, a receiver, a mobile telephone device, and a cordless data transmission system with a tunable filter arrangement, as well as to a tunable bulk acoustic wave resonator.

The stormy developments in the field of mobile telephony and the continuous miniaturization of cordless telephone devices lead to higher requirements being imposed on the individual components. Thus a high selectivity in the high frequency part is necessary for protecting the receiver from the rising number of potentially interfering signals from other systems. This is achieved, for example, by means of bandpass filters which transmit only a limited frequency band and which suppress all frequencies above and below this band.

At the present moment, filters with ceramic electromagnetic resonators are among the means used for this purpose. A miniaturization of these filters, however, is limited by the electromagnetic wavelength. So-called surface acoustic wave (SAW) filters built up from surface acoustic wave resonators can be given a considerably smaller construction. This is because the acoustic wavelength is smaller than the electromagnetic wavelength by 4 to 5 orders of magnitude. A surface acoustic wave resonator comprises a piezoelectric layer on which finger-shaped electrodes are provided. A signal applied to the input electrodes excites the piezoelectric material into mechanical vibrations, which propagate in the form of acoustic waves on the upper side of the layer and are converted back into an electric signal again by the output electrodes.

An alternative is formed by bulk acoustic wave (BAW) filters comprising bulk acoustic wave resonators. Bulk acoustic wave filters have advantages as regards their size, power, and IC compatibility. Bulk acoustic wave resonators are built up from three components in principle. The first component generates the acoustic wave and comprises a piezoelectric layer. Two electrodes arranged above and below the piezoelectric layer represent the second component. The third component has the task of acoustically insulating the substrate from the vibrations generated by the piezoelectric layer.

It is an interesting aspect that the properties of a resonator or filter can be varied. This may be done, for example, through coupling of a resonator or filter with a varicap diode. It is a disadvantage of the combination of active and passive components that the active components may be contaminated by the materials of the passive components during the manufacture of the resonator or filter.

An alternative possibility is disclosed in U.S. Pat. No. 5,446,306. This describes a semiconductor bulk acoustic wave resonator and a semiconductor bulk acoustic wave filter which comprises a semiconducting substrate, a first and second electrode, and arranged therebetween a piezoelectric layer of AlN or ZnO. The resonance frequency of the resonator is changed in that a DC voltage is applied to the electrodes.

The invention has for its object to provide a tunable filter arrangement which can be manufactured in a simple and inexpensive manner.

This object is achieved by means of a tunable filter arrangement which comprises a substrate and provided thereon an arrangement of at least two resonators coupled to one another, of which resonators there is at least one which contains a piezoelectric component of a ferroelectric material and to which a DC voltage source is connected.

When a DC voltage is applied to the first and the second electrode of a resonator, the electrical properties of the resonator, the resonance frequency, and the anti-resonance frequency will change. If the resonator is in a filter arrangement, the above will have an influence on the total filter characteristic. Ferroelectric materials have a much stronger dependence on an applied voltage as regards their dielectric constant $\epsilon$ than have, for example, AlN and ZnO. This means that the electrical properties of a resonator having a piezoelectric component made of a ferroelectric material are influenced much more strongly by the application of a DC voltage, so that the tuning range of the entire filter arrangement is substantially greater.

It is preferred in particular that the ferroelectric material is chosen from the group comprising $PbTi_{1-x}Zr_xO_3$ ($0 \leq x \leq 1$) with and without dopents of La, Nb or MN and with and without excess lead, $LiNbO_3$, $LiTaO_3$, $PbNb_2O_6$, $Pb_{1-x}Ca_xTiO_3$ ($0 \leq x \leq 1$), $[Pb(Mg_{1/3}Nb_{2/3})O_3]_x$—$[PbTiO_3]_{1-x}$ ($0 \leq x \leq 1$), $BaTiO_3$, $Ba_{1-x}Sr_xTiO_3$ ($0 \leq x \leq 1$) with and without dopants, $Ba_{1-x}Sr_xTiO_3$ ($0 \leq x \leq 1$) with and without addition of $VO_x$ ($1 \leq x \leq 2.5$) and/or $SiO_2$, $Ba_{1-x}Sr_xTiO_3$ ($0 \leq x \leq 1$) with MgO dopants, $[Ba_{1-x}Sr_xTiO_3]$—$Pb_{1-y}Ca_yTiO_3$ ($0 \leq x \leq 1$, $0 \leq y \leq 1$), $Ba_{1-x}Sr_xZr_yTi_{1-y}O_3$ ($0 \leq x \leq 1$, $0 \leq y \leq 1$) with and without dopants, $Ba_{1-x}Pb_xTiO_3$ ($0 \leq x \leq 1$) with and without excess lead, $Ba_{1-x}Ca_xTiO_3$ ($0 \leq x \leq 1$), $(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$), $K_{1-x}Na_xNbO_3$ ($0 \leq x \leq 1$), $(Cd,Na)NbO_3$, $(Bi,Na)TiO_3$, $(Bi,Na,Pb,Ba)TiO_3$, $Bi_7Ti_4NbO_{21}$, $(Ba_{1-x}Sr_x)_2NaNb_5O_{15}$ ($0 \leq x \leq 1$), $(Ba_{1-x}Sr_x)_2KNb_5O_{15}$ ($0 \leq x \leq 1$), $(Ba_{1-x+y/8}Sr_{x+y/8})_2Na_{1-y}Nb_5O_{15}$ ($0 \leq x \leq 1$, $0 \leq y \leq 1$) with and without excess $Na^+$, $(Ba_{1-x+y/8}Sr_{x+y/8})_2K_{1-y}Nb_5O_{15}$ ($0 \leq x \leq 1$, $0 \leq y \leq 1$) with and without excess $K^+$, $(Ba_{1-x}Sr_x)_2K_{1-3y}SE_yNb_5O_{15}$ ($0 \leq x \leq 1$, $0 \leq y \leq 1$, SE=ion from the group of rare earths), $Sr_2Ba_4Ti_2Nb_8O_{30}$, a) $Pb(Mg_{1/2}W_{1/2})O_3$,
b) $Pb(Fe_{1/2}Nb_{1/2})O_3$,
c) $Pb(Fe_{2/3}W_{1/3})O_3$,
d) $Pb(Ni_{1/3}Nb_{2/3})O_3$,
e) $Pb(Zn_{1/3}Nb_{2/3})O_3$,
f) $Pb(Sc_{1/2}Ta_{1/2})O_3$ and combinations of the compounds a) to f) with $PbTiO_3$ and/or $Pb(Mg_{1/3}Nb_{2/3})O_3$ with and without excess lead.

It is preferred that the resonators are chosen from the group of bulk acoustic wave resonators and surface acoustic wave resonators.

Filter arrangements with bulk acoustic wave resonators or surface acoustic wave resonators can be manufactured with a high quality factor Q and a high coupling factor k.

It is particularly preferred that the resonators are constructed in the thin film technology.

The construction of the resonators in thin film technology on a substrate renders it possible to obtain such a filter arrangement with small dimensions.

It is particularly highly preferred that the bulk acoustic wave resonators each comprise a resonator unit of a lower and upper electrode and a piezoelectric layer arranged therebetween and a reflection element which is positioned between the substrate and the resonator unit.

Such a bulk acoustic wave resonator can be manufactured without cumbersome lithographic processes because the resonance frequency of the resonator is defined by the layer thickness of the piezoelectric layer. In addition, such a bulk acoustic wave resonator is clearly more robust than other types of bulk acoustic wave resonators such as single-crystal resonators, resonators with membranes, or resonators with air gaps.

The invention further relates to a transmitter, a receiver, a mobile telephone device, and a wireless data transmission system provided with a tunable filter arrangement which comprises a substrate and provided thereon an arrangement of at least two resonators which are coupled to one another, of which resonators there is at least one which has a piezoelectric component made of a ferroelectric material and to which a DC voltage source is connected.

The invention further relates also to a tunable bulk acoustic wave resonator which comprises a substrate and provided thereon a resonator unit having a lower and upper electrode as well as a piezoelectric layer arranged therebetween, and a reflection element which is positioned between the substrate and the resonator unit, to which resonator a DC voltage source is connected.

The strong dependence of the dielectric constant ε on an applied voltage means that the electrical properties of the bulk acoustic wave resonator can be tuned over a wide range.

BRIEF DESCRIPTION OF THE DRAWINGS

The invention will be explained in more detail below with reference to two Figures and two embodiments. In the Figures

DETAILED DESCRIPTION OF THE PREFERRED EMBODIMENTS

Figure 1:
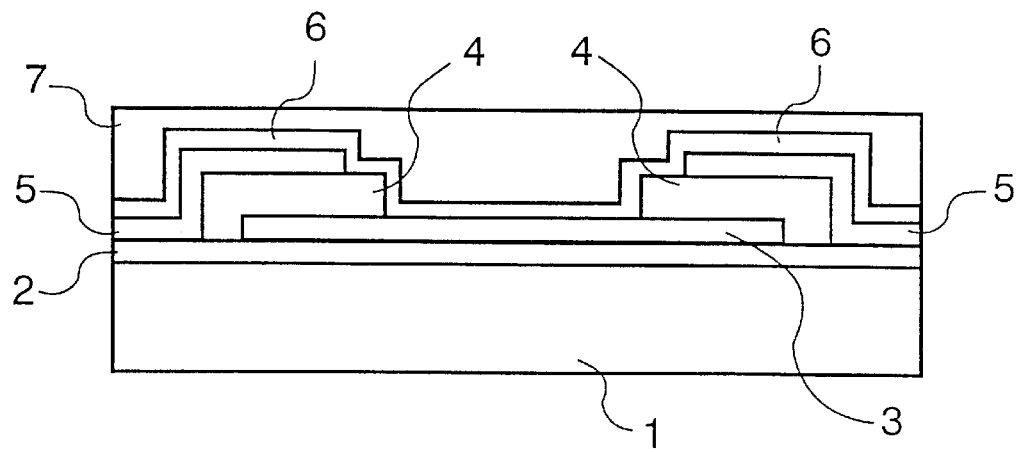
FIG. 1 is a cross-sectional view showing the construction of an embodiment of a tunable bulk acoustic wave filter arrangement.

In FIG. 1, a tunable filter arrangement comprising two bulk acoustic wave resonators has a substrate 1 which comprises, for example, a ceramic material, a ceramic material with a glass planarizing layer, a glass-ceramic material, a glass material, Si, GaAs, or sapphire. If silicon or GaAs is used, an additional passivating layer of, for example, $SiO_2$ or glass is provided on the substrate 1. On the substrate 1 there is a reflection element 2 which is a layer of an acoustically reflecting substance from the group of polymers and porous substances. The acoustically reflecting substance used may be, for example, an aerogel, a xerogel, a glass foam, a foam-type adhesive, a synthetic foam, or a synthetic resin of low density. The aerogel used may be, for example, an inorganic aerogel composed of silica gel or porous $SiO_2$ structures, or an organic aerogel such as, for example, a resorcin-formaldehyde aerogel, a melamine-formaldehyde aerogel, or a phenol-formaldehyde aerogel. The xerogel used may be, for example, an inorganic xerogel such as highly condensed polysilicic acid or an organic xerogel such as glue or agar—agar. Foamed substances may be chemically foamed or physically foamed polymers such as, for example, polystyrol, polycarbonate, polyvinyl chloride, polyurethane, polyisocyanate, polyisocyanurate, polycarbodiimide, polymethacryl imide, polyacryl imide, acryl-butadiene-styrol copolymers, polypropylene, or polyester. In addition, foamed synthetic resins such as, for example, phenyl-formaldehyde resins or furane resins having a high porosity owing to carbonization may be used. The synthetic resin of low density used may be, for example, a crosslinked polyvinyl ether, a crosslinked polyaryl ether, polytetrafluoroethylene, poly(p-xylylene), poly(2-chloro-p-xylylene), poly(dichloro-p-xylylene), polybenzocyclobutene, a styrol-butadiene copolymer, an ethylene-vinyl acetate polymer, or an organic siloxane polymer. A resonator unit comprising a first electrode 3, a piezoelectric layer 4, and a second electrode 5 is provided on the reflection element 2. The electrodes 3 and 5 are preferably made from a well conducting material with low acoustic damping and may comprise, for example, $Ag_{1-x}Pt_x$ ($0 \leq x \leq 1$), Pt with a layer thickness of 50 nm to 1 μm, Ti with a layer thickness of 1 to 20 nm/Pt with a layer thickness of 20 to 600 nm, Ti with a layer thickness of 1 to 20 nm/Pt with a layer thickness of 20 to 600 nm/Ti with a layer thickness of 1 to 20 nm, Al, Al doped with a few percents of Cu, Al doped with a few percents of Si, Al doped with a few percents of Mg, W, Ni, Mo, Au, Cu, Ti/Pt/Al, Ti/Ag, Ti/Pt/Ti, Ti/Ag/Ir, Ti/Ir, Ti/Pd, $Ti/Ag_{1-x}Pt_x$ ($0 \leq x \leq 1$), $Ti/Ag_{1-x}Pd_x$ ($0 \leq x \leq 1$), $Ti/Pt_{1-x}Al_x$ ($0 \leq x \leq 1$), $Pt_{1-x}Al_x$ ($0 \leq x \leq 1$), $Ti/Ag/Pt_{1-x}Al_x$ ($0 \leq x \leq 1$), $Ti/Ag/Ru$, $Ti/Ag/Ir/IrO_x$ ($0 \leq x \leq 2$), $Ti/Ag/Ru/RuO_x$ ($0 \leq x \leq 2$), $Ti/Ag/Ru/Ru_xPt_{1-x}$ ($0 \leq x \leq 1$), $Ti/Ag/Ru/Ru_xPt_{1-x}/RuO_y$ ($0 \leq x \leq 1$, $0 \leq y \leq 2$), $Ti/Ag/Ru/RuO_x/Ru_yPt_{1-y}$ ($0 \leq x \leq 2$, $0 \leq y \leq 1$), $Ti/Ag/Ru_xPt_{1-x}$ ($0 \leq x \leq 1$), $Ti/Ag/Pt_xAl_{1-x}$ ($0 \leq x \leq 1$), $Pt_xAl_{1-x}/Ag/Pt_yAl_{1-y}$ ($0 \leq x \leq 1$, $0 \leq y \leq 1$), $Ti/Ag/Pt_y(RhO_x)_{1-y}$ ($0 \leq x \leq 2$, $0 \leq y \leq 1$), $Ti/Ag/Rh/RhO_x$ ($0 \leq x \leq 2$), $Ti/Ag/Pt_xRh_{1-x}$ ($0 \leq x \leq 1$), $Ti/Ag/Pt_y(RhO_x)_{1-y}/Pt_zRh_{1-z}$ ($0 \leq x \leq 2$, $0 \leq y \leq 1$, $0 \leq z \leq 1$), $Ti/Ag_xPt_{1-x}/Ir$ ($0 \leq x \leq 1$), $Ti/Ag_xPt_{1-x}/Ir/IrO_y$ ($0 \leq x \leq 1$, $0 \leq y \leq 2$), $Ti/Ag_xPt_{1-x}/Pt_yAl_{1-y}$ ($0 \leq x \leq 1$, $0 \leq y \leq 1$), $Ti/Ag_xPt_{1-x}/Ru$ ($0 \leq x \leq 1$), $Ti/Ag_xPt_{1-x}/Ru/RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Ru, Rh, $Rh/RhO_2$, Ti/Ni/Al/ITO, Ti/Ni, Ti/W/Ti, $W_xTi_{1-x}$ ($0 \leq x \leq 1$), $W_xTi_{1-x}/Al(Cu)$ ($0 \leq x \leq 1$), $W_xTi_{1-x}/Al(Si)$ ($0 \leq x \leq 1$), $W_xTi_{1-x}/Al$ ($0 \leq x \leq 1$) or Ti/Cu. The material used for the piezoelectric layer 4 may be, for example, $PbTi_{1-x}Zr_xO_3$ ($0 \leq x \leq 1$) with and without dopents of La, Nb or Mn and with and without excess lead, $LiNbO_3$, $LiTaO_3$, $PbNb_2O_6$, $Pb_{1-x}Ca_xTiO_3$ ($0 \leq x \leq 1$), $[Pb(Mg_{1/3}Nb_{2/3})O_3]_x$—$[PbTiO_3]_{1-x}$ ($0 \leq x \leq 1$), $BaTiO_3$, $Ba_{1-x}Sr_xTiO_3$ ($0 \leq x \leq 1$) with and without dopants, $Ba_{1-x}Sr_xTiO_3$ ($0 \leq x \leq 1$) with and without addition of $VO_x$ ($1 \leq x \leq 2.5$) and/or $SiO_2$, $Ba_{1-x}Sr_xTiO_3$ ($0 \leq x \leq 1$) with MgO dopants, $[Ba_{1-x}Sr_xTiO_3]$—$Pb_{1-y}Ca_yTiO_3$ ($0 \leq x \leq 1$, $0 \leq y \leq 1$), $Ba_{1-x}Sr_xZr_yTi_{1-y}O_3$ ($0 \leq x \leq 1$, $0 \leq y \leq 1$) with and without dopants, $Ba_{1-x}Pb_xTiO_3$ ($0 \leq x \leq 1$) with and without excess lead, $Ba_{1-x}Ca_xTiO_3$ ($0 \leq x \leq 1$), $(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$), $K_{1-x}Na_xNbO_3$ ($0 \leq x \leq 1$), $(Cd,Na)NbO_3$, $(Bi,Na)TiO_3$, $(Bi,Na,Pb,Ba)TiO_3$, $Bi_7Ti_4NbO_{21}$, $(Ba_{1-x}Sr_x)_2NaNb_5O_{15}$ ($0 \leq x \leq 1$), $(Ba_{1-x}Sr_x)_2KNb_5O_{15}$ ($0 \leq x \leq 1$), $(Ba_{1-x+y/8}Sr_{x+y/8})_2Na_{1-y}Nb_5O_{15}$ ($0 \leq x \leq 1$, $0 \leq y \leq 1$) with and without excess $Na^+$, $(Ba_{1-x+y/8}Sr_{x+y/8})_2K_{1-y}Nb_5O_{15}$ ($0 \leq x \leq 1$, $0 \leq y \leq 1$) with and without excess $K^+$, $(Ba_{1-x}Sr_x)_2K_{1-3y}SE_yNb_5O_{15}$ ($0 \leq x \leq 1$, $0 \leq y \leq 1$, SE=ion from the group of rare earths), $Sr_2Ba_4Ti_2Nb_8O_{30}$, a) $Pb(Mg_{1/2}W_{1/2})O_3$,
b) $Pb(Fe_{1/2}Nb_{1/2})O_3$,
c) $Pb(Fe_{2/3}W_{1/3})O_3$,
d) $Pb(Ni_{1/3}Nb_{2/3})O_3$,
e) $Pb(Zn_{1/3}Nb_{2/3})O_3$,
f) $Pb(Sc_{1/2}Ta_{1/2})O_3$ and combinations of the compounds a) to f) with $PbTiO_3$ and/or $Pb(Mg_{1/3}Nb_{2/3})O_3$ with and without excess lead In a further embodiment of the invention, a second reflection element 6 may additionally be provided on the upper electrode 5.

A protective layer 7 of an organic or inorganic material, or a combination of these materials, may be provided over the entire filter arrangement. The organic material used may be, for example, polybenzocyclobutene or polyimide, and the inorganic material used may be, for example, $Si_3N_4$, $SiO_2$, or $Si_xO_yN_z$ ($0 \leq x \leq 1$, $0 \leq y \leq 1$, $0 \leq z \leq 1$).

Contact holes are opened through the protective layer 7 to the first electrode 3 and the second electrode 5 by means of etching. Bump end contacts of, for example, Cr/Cu, Cr/Cu/Ni/Sn, or Cr/Cu/Ni/Au are grown in the contact holes. A DC voltage can be applied to the electrodes 3 and 5 through these bump end contacts.

Alternatively, the reflection elements 2 and 6 may each comprise several layers of alternately high and low impedance, each layer having a layer thickness of one fourth the resonance wavelength $\lambda$. The material of low impedance may be, for example, an organic or inorganic aerogel, an organic or inorganic xerogel, a glass foam, a foam-type adhesive, a synthetic foam, a synthetic resin of low density, or $SiO_2$. The material of high acoustic impedance used may be, for example, $HfO_2$, Mo, Au, Ni, Cu, W, Ti/W/Ti, $W_xTi_{1-x}$ ($0 \leq x \leq 1$), diamond, AlN, $Ta_2O_5$, Pt, Ti/Pt, or a synthetic resin of high density such as, for example, high-density polyethylene (HDPE).

If so desired, an alternative type of bulk acoustic wave resonator such as, for example, a single-crystal resonator, a resonator with membrane, or a resonator with an air gap may be used, or a surface acoustic wave resonator may be used in the tunable filter arrangement with a correspondingly different design of the electrodes 3, 5 and the piezoelectric layer 4.

In a further embodiment of the invention, a second reflection element may additionally be provided on the upper electrode 5.

A further alternative is that an additional adhesive layer, for example of an acrylate glue or an epoxy glue, is provided between the reflection element 2 and the substrate 1. The acrylate glue may comprise, for example, acryl or methacryl monomers which polymerize during the adhesion process. Above or below, or above and below a reflection element 2 of porous $SiO_2$, furthermore, a layer of $SiO_2$ with a layer thickness of between 30 and 300 nm may be provided. These $SiO_2$ layers, the reflection element 2, and a second reflection element may be provided over the entire region of the substrate 1 or only partly, in the region of a resonator unit.

In addition, the entire filter arrangement may be provided with at least a first and a second current supply contact. The current supply contact used may be, for example, an electroplated SMD end contact of Cr/Cu, Ni/Sn, or Cr/Cu, Cu/Ni/Sn, or Cr/Ni, Pb/Sn, or Cr/Cu, Ni/Au, or a bump end contact, or a contact pad.

Further alternative embodiments as regards construction and integration are known to those skilled in the art. Thus a tunable filter arrangement comprising resonators may have more than two resonators.

Figure 2:
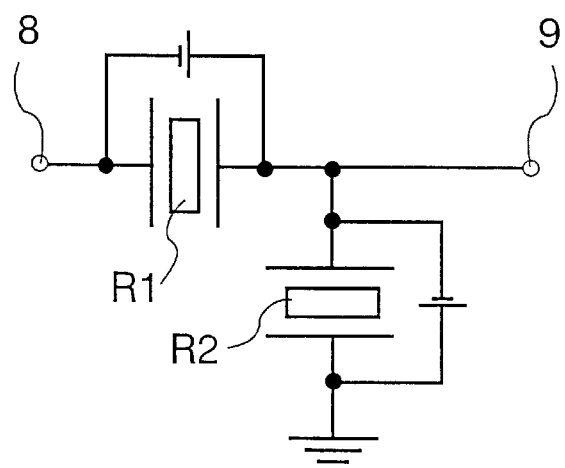
FIG. 2 is the circuit diagram of a tunable filter arrangement.

FIG. 2 shows a filter arrangement with two resonators R1 and R2. A serial resonator R1 is present between an input 8 and an output 9. In addition, the filter arrangement comprises a parallel resonator R2 whose first connection terminal lies between the resonator R1 and the output 9 and whose second connection terminal is connected to ground. Furthermore, the two resonators R1 and R2 are each connected to a DC voltage source.

Embodiments of the invention will be explained in more detail below, representing examples of how the invention may be realized in practice.

Embodiment 1

An adhesive layer of acrylate glue with a layer of porous $SiO_2$ disposed thereon as a reflection element 2 is present on a substrate 1 of glass. A first electrode 3 of Pt is provided on the reflection element 2. A piezoelectric layer 4 of $PbZr_{0.15}Ti_{0.85}O_3$ with 2% lanthanum doping is present on certain portions of the first electrode 3 and the reflection element 2. A second electrode 5 of Pt/Ti is provided on certain portions of the piezoelectric layer 4 and the reflection element 2. The piezoelectric layer 4 and the two electrodes 3, 5 were deposited and structured such that a filter arrangement in accordance with FIG. 2 having two resonator units R1 and R2 were created. A protective layer 7 of $SiO_2$ is provided over the entire filter arrangement. Contact holes are opened through the protective layer 7 to the first electrode 3 and the second electrode 5 by means of etching. Bump end contacts of Cr/Cu/Ni/Au are grown in the contact holes. One bump end contact to the electrode 5 in the region of the resonator R1 serves as a contact to the input 8 of the filter arrangement, and respective bump end contacts to the electrode 3 in the region of the resonator R1 and in the region of the resonator R2 serve as contacts for the output 9 of the filter arrangement. In addition, a bump end contact to the electrode 5 in the region of the resonator R2 is connected to ground. A DC voltage can be applied to the electrodes 3 and 5 via these bump end contacts.

The two resonators R1 and R2 are so attuned to one another that the resonance frequency of the resonator R1 corresponds to the anti-resonance frequency of the resonator R2. The filter characteristic of the filter arrangement can be changed through the application of a DC voltage to the two resonators, because the dielectric constant e of the ferroelectric material in the piezoelectric layer 4 is reduced thereby. The resonance frequencies and the anti-resonance frequencies of the tunable resonators are shifted thereby.

The resulting filter arrangement was used in mobile telephones as a tunable bandpass filter whose filter band can be changed.

Embodiment 2

An adhesive layer of acrylate glue with a 300 nm thick layer of $SiO_2$, a reflection element 2 of porous $SiO_2$, and a 30 nm thick layer of $SiO_2$ thereon is present on a substrate 1 of glass. A first electrode 3 of Pt/Ti is provided on a certain portion of the 30 nm thick $SiO_2$ layer. A piezoelectric layer 4 of $PbZr_{0.35}Ti_{0.65}O_3$ is present on certain portions of the first electrode 3 and the reflection element 2. A second electrode 5 of Pt/Ti is provided on certain portions of the piezoelectric layer 4 and the reflection element 2. The piezoelectric layer 4 and the two electrodes 3, 5 were deposited and structured such that a filter arrangement in accordance with FIG. 2 having two resonator units R1 and R2 were created. A protective layer 7 of $SiO_2$ is provided over the entire filter arrangement. Contact holes are opened through the protective layer 7 to the first electrode 3 and the second electrode 5 by means of etching. Bump end contacts of Cr/Cu/Ni/Au are grown in the contact holes. One bump end contact to the electrode 5 in the region of the resonator R1 serves as a contact to the input 8 of the filter arrangement, and respective bump end contacts to the electrode 3 in the region of the resonator R1 and in the region of the resonator R2 serve as contacts for the output 9 of the filter arrangement. In addition, a bump end contact to the electrode 5 in the region of the resonator R2 is connected to ground. A DC voltage can be applied to the electrodes 3 and 5 via these bump end contacts.

The two resonators R1 and R2 are so attuned to one another that the resonance frequency of the resonator R1 corresponds to the anti-resonance frequency of the resonator R2. The filter characteristic of the filter arrangement can be changed through the application of a DC voltage to the two resonators, because the dielectric constant $\epsilon$ of the ferroelectric material in the piezoelectric layer 4 is reduced thereby. The resonance frequencies and the anti-resonance frequencies of the tunable resonators are shifted thereby.

The resulting filter arrangement was used in mobile telephones as a tunable bandpass filter whose filter band can be changed.

Embodiment 3

A reflection element 2 with alternating $\lambda/4$ layers of $Ta_2O_5$ and $SiO_2$ is present on a silicon substrate 1 with an $SiO_2$ passivating layer. A first electrode 3 of Ti/Pt is provided on the reflection element 2. A piezoelectric layer 4 of $PbZr_{0.15}Ti_{0.85}O_3$ with 2% lanthanum doping is present on certain portions of the first electrode 3 and the reflection element 2. A second electrode 5 of Pt/Ti is provided on certain portions of the piezoelectric layer 4 and the reflection element 2. The piezoelectric layer 4 and the two electrodes 3, 5 were deposited and structured such that a filter arrangement in accordance with FIG. 2 having two resonator units R1 and R2 were created. A protective layer 7 of $Si_3N_4$ is provided over the entire filter arrangement. Contact holes are opened through the protective layer 7 to the first electrode 3 and the second electrode 5 by means of etching. Bump end contacts of Cr/Cu/Ni/Au are grown in the contact holes. One bump end contact to the electrode 5 in the region of the resonator R1 serves as a contact to the input 8 of the filter arrangement, and respective bump end contacts to the electrode 3 in the region of the resonator R1 and in the region of the resonator R2 serve as contacts for the output 9 of the filter arrangement. In addition, a bump end contact to the electrode 5 in the region of the resonator R2 is connected to ground. A DC voltage can be applied to the electrodes 3 and 5 via these bump end contacts.

The two resonators R1 and R2 are so attuned to one another that the resonance frequency of the resonator R1 corresponds to the anti-resonance frequency of the resonator R2. The filter characteristic of the filter arrangement can be changed through the application of a DC voltage to the two resonators, because the dielectric constant $\epsilon$ of the ferroelectric material in the piezoelectric layer 4 is reduced thereby. The resonance frequencies and the anti-resonance frequencies of the tunable resonators are shifted thereby.

The resulting filter arrangement was used in mobile telephones as a tunable bandpass filter whose filter band can be changed.

What is claimed is:

1. A tunable filter arrangement which comprises a substrate and provided thereon an arrangement of at least two resonators coupled to one another, of which resonators there is at least one which contains a piezoelectric component of a ferroelectric material and to which a DC voltage source is connected, the arrangement further comprising lower and upper electrodes, a reflection element said lower electrode and a second reflection element above said upper electrode.

2. A tunable filter arrangement as claimed in claim 1, characterized in that the ferroelectric material is chosen from the group consisting of $PbTi_{1-x}Zr_xO_3$ ($0 \leq x \leq 1$), $LiNbO_3$, $LiTaO_3$, $PbNb_2O_6$, $Pb_{1-x}Ca_xTiO_3$ ($0 \leq x \leq 1$), $[Pb(Mg_{1/3}Nb_{2/3})O_3]$—$[PbTiO_3]_{1-x}$ ($0 \leq x \leq 1$), $BaTiO_3$, $Ba_{1-x}Sr_xTiO_3$ ($0 \leq x \leq 1$), $Ba_{1-x}Sr_xTiO_3$ ($0 \leq x \leq 1$) ($1 \leq x \leq 2.5$), $[Ba_{1-x}Sr_xTiO_3]$—$[Pb_{1-x}Ca_xTiO_3]$ ($0 \leq x \leq 1$, $0 \leq y \leq 1$), $Ba_{1-x}Sr_xZr_yTi_{1-y}O_3$ ($0 \leq x \leq 1$, $0 \leq y \leq 1$), $Ba_{1-x}Pb_xTiO_3$ ($0 \leq x \leq 1$), $Ba_{1-x}Ca_xTiO_3$ ($0 \leq x \leq 1$), $(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$), $K_{1-x}Na_xNbO_3$ ($0 \leq x \leq 1$), $(Cd,Na)NbO_3$, $(Bi,Na)TiO_3$, $(Bi,Na,Pb,Ba)TiO_3$, $Bi_7Ti_4NbO_{21}$, $(Ba_{1-x}Sr_x)_2NaNb_5O_{15}$ ($0 \leq x \leq 1$), $(Ba_{1-x}Sr_x)_2KNb_5O_{15}$ ($0 \leq x \leq 1$), $(Ba_{1-x+y/8}Sr_{x+y/8})_2Na_{1-y}Nb_5O_{15}$ ($0 \leq x \leq 1$, $0 \leq y \leq 1$), $(B_{1-x+y/8}Sr_{x+y/8})_2K_{1-y}Nb_5O_{15}$ ($0 \leq x \leq 1$, $0 \leq y \leq 1$), $(Ba_{1-x}Sr_x)_2K_{1-3y}SE_yNb_5O_{15}$ ($0 \leq x \leq 1$, $0 \leq y \leq 1$, SE=ion from the group of rare earths), $Sr_2Ba_4Ti_2Nb_8O_{30}$, a) $Pb(Mg_{1/2}W_{1/2})O_3$,
b) $Pb(Fe_{1/2}Nb_{1/2})O_3$,
c) $Pb(Fe_{2/3}W_{1/3})O_3$,
d) $Pb(Ni_{1/3}Nb_{2/3})O_3$,
e) $Pb(Zn_{1/3}Nb_{2/3})O_3$,
f) $Pb(Sc_{1/2}Ta_{1/2})O_3$ and combinations of the compounds a) to f) with $PbTiO_3$ and/or $Pb(Mg_{1/3}Nb_{2/3})O_3$.

3. A tunable filter arrangement as claimed in claim 1, characterized in that the resonators are bulk acoustic wave resonators.

4. A tunable filter arrangement as claimed in claim 3, characterized in that the resonators are constructed in the thin film technology.

5. A tunable filter arrangement as claimed in claim 3, characterized in that the chosen resonators are bulk acoustic wave resonators that each comprise a resonator unit of a lower and upper electrode and a piezoelectric layer arranged therebetween and a reflection element which is positioned between the substrate and the resonator unit.

6. A mobile telephone device provided with a tunable filter arrangement which comprises a substrate and provided thereon an arrangement of at least two resonators which are coupled to one another, of which resonators there is at least one which has a piezoelectric component made of a ferroelectric material and to which a DC voltage source is connected, the arrangement further comprising lower and upper electrodes, a reflection element below said lower electrode and a second reflection element above said upper electrode.

7. A transmitter provided with a tunable filter arrangement which comprises a substrate and provided thereon an arrangement of at least two resonators which are coupled to one another, of which resonators there is at least one which has a piezo electric component made of a ferroelectric material and to which a DC voltage source is connected, said transmitter comprising at least two reflection layers separated by at least one electrode.

8. A receiver provided with a tunable filter arrangement which comprises a substrate and provided thereon an arrangement of at least two resonators which are coupled to one another, of which resonators there is at least one which has a piezoelectric component made of a ferroelectric material and to which a DC voltage source is connected, and wherein a layer of said resonator separates two reflective layers.

* * * * *